United States Patent
Imai

(10) Patent No.: US 10,615,031 B2
(45) Date of Patent: Apr. 7, 2020

(54) SILICON CARBIDE SEMICONDUCTOR SUBSTRATE AND METHOD OF MANUFACTURING SILICON CARBIDE SEMICONDUCTOR SUBSTRATE

(71) Applicant: FUJI ELECTRIC CO., LTD., Kawasaki-shi, Kanagawa (JP)

(72) Inventor: Fumikazu Imai, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/666,531

(22) Filed: Aug. 1, 2017

(65) Prior Publication Data

US 2018/0040480 A1 Feb. 8, 2018

(30) Foreign Application Priority Data

Aug. 5, 2016 (JP) .................. 2016-155091

(51) Int. Cl.
| | |
|---|---|
| H01L 21/02 | (2006.01) |
| C30B 25/10 | (2006.01) |
| C30B 25/16 | (2006.01) |
| C30B 25/20 | (2006.01) |
| C30B 29/36 | (2006.01) |
| H01L 29/36 | (2006.01) |
| H01L 29/16 | (2006.01) |

(52) U.S. Cl.
CPC ........ *H01L 21/02584* (2013.01); *C30B 25/10* (2013.01); *C30B 25/165* (2013.01); *C30B 25/20* (2013.01); *C30B 29/36* (2013.01); *H01L 21/0262* (2013.01); *H01L 21/02378* (2013.01); *H01L 21/02529* (2013.01); *H01L 21/02576* (2013.01); *H01L 21/02579* (2013.01); *H01L 29/365* (2013.01); *H01L 29/1608* (2013.01)

(58) Field of Classification Search
CPC ........ H01L 21/02584; H01L 21/02378; H01L 21/02529; H01L 21/02576; H01L 21/02579; H01L 21/0262; H01L 29/365; H01L 29/1608; C30B 25/10; C30B 25/165; C30B 25/20
See application file for complete search history.

(56) References Cited

U.S. PATENT DOCUMENTS

| | | | | |
|---|---|---|---|---|
| 6,218,680 B1 * | 4/2001 | Carter, Jr. | ............... | C30B 23/00 257/77 |
| 2004/0201024 A1 * | 10/2004 | Tsvetkov | ............... | C30B 31/00 257/77 |
| 2006/0174825 A1 * | 8/2006 | Basceri | .................. | C30B 23/00 117/89 |

FOREIGN PATENT DOCUMENTS

| | | |
|---|---|---|
| JP | 2012-253115 A | 12/2012 |
| JP | 2015-002207 A | 1/2015 |

\* cited by examiner

*Primary Examiner* — Mark W Tornow
(74) *Attorney, Agent, or Firm* — Rabin & Berdo, P.C.

(57) ABSTRACT

A silicon carbide semiconductor substrate includes an epitaxial layer. A difference of a donor concentration and an acceptor concentration of the epitaxial layer is within a range from $1 \times 10^{14}/cm^3$ to $1 \times 10^{15}/cm^3$. Further, the donor concentration and the acceptor concentration of the epitaxial layer are a concentration unaffected by an impurity inside epitaxial growth equipment.

7 Claims, 3 Drawing Sheets

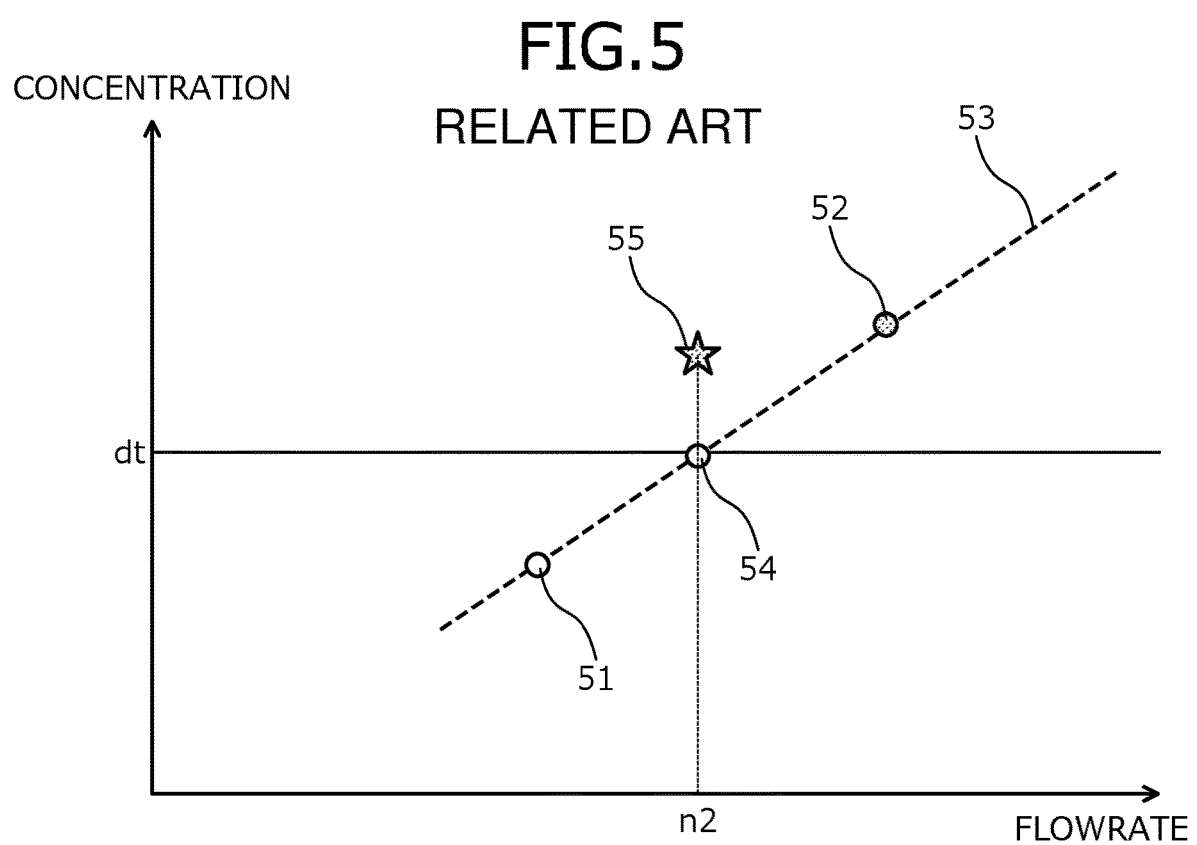

SILICON CARBIDE SEMICONDUCTOR SUBSTRATE AND METHOD OF MANUFACTURING SILICON CARBIDE SEMICONDUCTOR SUBSTRATE

CROSS REFERENCE TO RELATED APPLICATIONS

This application is based upon and claims the benefit of priority of the prior Japanese Patent Application No. 2016-155091, filed on Aug. 5, 2016, the entire contents of which are incorporated herein by reference.

BACKGROUND OF THE INVENTION

1. Field of the Invention

Embodiments of the invention relate to a silicon carbide semiconductor substrate and a method of manufacturing a silicon carbide semiconductor substrate.

2. Description of the Related Art

Conventionally, single crystal silicon carbide (SiC) epitaxial (hereinafter, epitaxial may be abbreviated as "epi") substrates, which are single crystal SiC substrates on which a single crystal SiC is formed by epitaxial growth, have been researched, developed, and put into practical use for applications such as high-voltage Schottky diodes of 1 kV and high-voltage metal oxide semiconductor field effect transistors (MOSFETs).

However, to realize an ultrahigh-voltage, low-loss device of 10 kV, a single crystal SiC epi substrate, which is a single crystal silicon carbide semiconductor substrate on which a low-concentration single crystal SiC having an impurity concentration of $1\times10^{14}/cm^3$ to $1\times10^{15}/cm^3$ is formed by epitaxial growth, has to be produced (manufactured). Hereinafter, single crystal SiC formed by epitaxial growth on a single crystal silicon carbide semiconductor substrate may be abbreviated as "epi deposited film".

According to one technique, an epi layer of a low nitrogen ($N_2$) concentration of about $1\times10^{14}/cm^3$ to $1\times10^{17}/cm^3$ is formed as a low-concentration epi deposited film (for example, refer to Japanese Laid-Open Patent Publication No. 2015-002207). According to another technique, an epitaxial layer having an impurity concentration from $1\times10^{14}/cm^3$ to $1\times10^{16}/cm^3$ is formed by epitaxial growth (for example, refer to Japanese Laid-Open Patent Publication No. 2012-253115).

SUMMARY OF THE INVENTION

According to one aspect of the present invention, a silicon carbide semiconductor substrate includes an epitaxial layer having a donor concentration and an acceptor concentration that are equal to or higher than a concentration unaffected by an impurity inside epitaxial growth equipment. A difference of the donor concentration and the acceptor concentration ranges from $1\times10^{14}/cm^3$ to $1\times10^{15}/cm^3$.

In the silicon carbide semiconductor substrate according, a donor is nitrogen and an acceptor is boron.

In the silicon carbide semiconductor substrate, the concentration unaffected by the impurity is $1\times10^{15}/cm^3$ or higher.

A method of manufacturing a silicon carbide semiconductor substrate includes supplying a dopant gas including a donor and an acceptor, and forming a film of a single crystal silicon carbide on a single crystal silicon carbide substrate by epitaxial growth. A flowrate of the donor and the acceptor in the dopant gas is equal to or higher than a flowrate by which a donor concentration of the film and an acceptor concentration of the film are a concentration unaffected by an impurity inside epitaxial growth equipment. The flowrate of the donor and the acceptor in the dopant gas is a flowrate by which a difference of the donor concentration of the film and the acceptor concentration of the film ranges from $1\times10^{14}/cm^3$ to $1\times10^{15}/cm^3$.

The method includes, before forming the film: supplying a dopant gas including the donor, forming a film of a single crystal silicon carbide on a single crystal silicon carbide substrate by epitaxial growth, and obtaining a first relationship of a flowrate in the dopant gas and a donor concentration of the film; supplying a dopant gas including the acceptor, forming a film of a single crystal silicon carbide on a single crystal silicon carbide substrate by epitaxial growth, and obtaining a second relationship of a flowrate in the dopant gas and an acceptor concentration of the film; and determining the flowrate of the dopant gas based on the first relationship and the second relationship;

In the method, the donor is nitrogen and the acceptor is boron.

In the method, the concentration unaffected by the impurity is $1\times10^{15}/cm^3$ or higher.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is graph of results obtained when conditions were set and formation was performed to determine concentration dependency in a conventional silicon carbide semiconductor substrate.

DETAILED DESCRIPTION OF THE INVENTION

Figure 1:
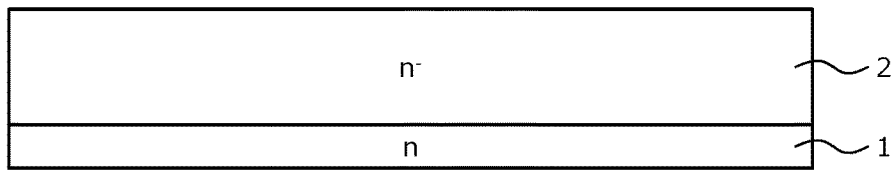
FIG. 1 is a cross-sectional view of a silicon carbide semiconductor substrate according to an embodiment.

Embodiments of a silicon carbide semiconductor substrate and a method of manufacturing a silicon carbide semiconductor substrate according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "-" to the index.

FIG. 1 is a cross-sectional view of the silicon carbide semiconductor substrate according to an embodiment. As depicted in FIG. 1, in the silicon carbide semiconductor substrate according to the embodiment, on a first main surface (front surface), for example, (0001) face (Si face), of an n-type silicon carbide substrate (single crystal silicon carbide substrate) 1, an n$^-$-type epitaxial layer (epitaxial layer) 2 is deposited.

The n-type silicon carbide substrate 1 is a silicon carbide single crystal substrate. The n$^-$-type epitaxial layer 2 is, for example, a low-concentration type drift layer having an impurity concentration lower than that of the n-type silicon carbide substrate 1. The n$^-$-type epitaxial layer 2 is a film formed by epitaxial growth. In the n$^-$-type epitaxial layer 2, a difference of donor concentration and acceptor concentration is in a range from $1\times10^{14}$/cm$^3$ to $1\times10^{15}$/cm$^3$. Therefore, the impurity concentration of the n$^-$-type epitaxial layer 2 is $1\times10^{14}$/cm$^3$ to $1\times10^{15}$/cm$^3$. Further, in the n$^-$-type epitaxial layer 2, the donor concentration and the acceptor concentration are equal to or higher than a concentration not affected by impurities inside the epitaxial growth equipment 4.

Here, a donor of the n$^-$-type epitaxial layer 2 is, for example, nitrogen. An acceptor of the n$^-$-type epitaxial layer 2 is, for example, boron (B). Further, a concentration not affected by impurities inside the epitaxial growth equipment 4 is, for example, $1\times10^{15}$/cm$^3$.

Figure 2:
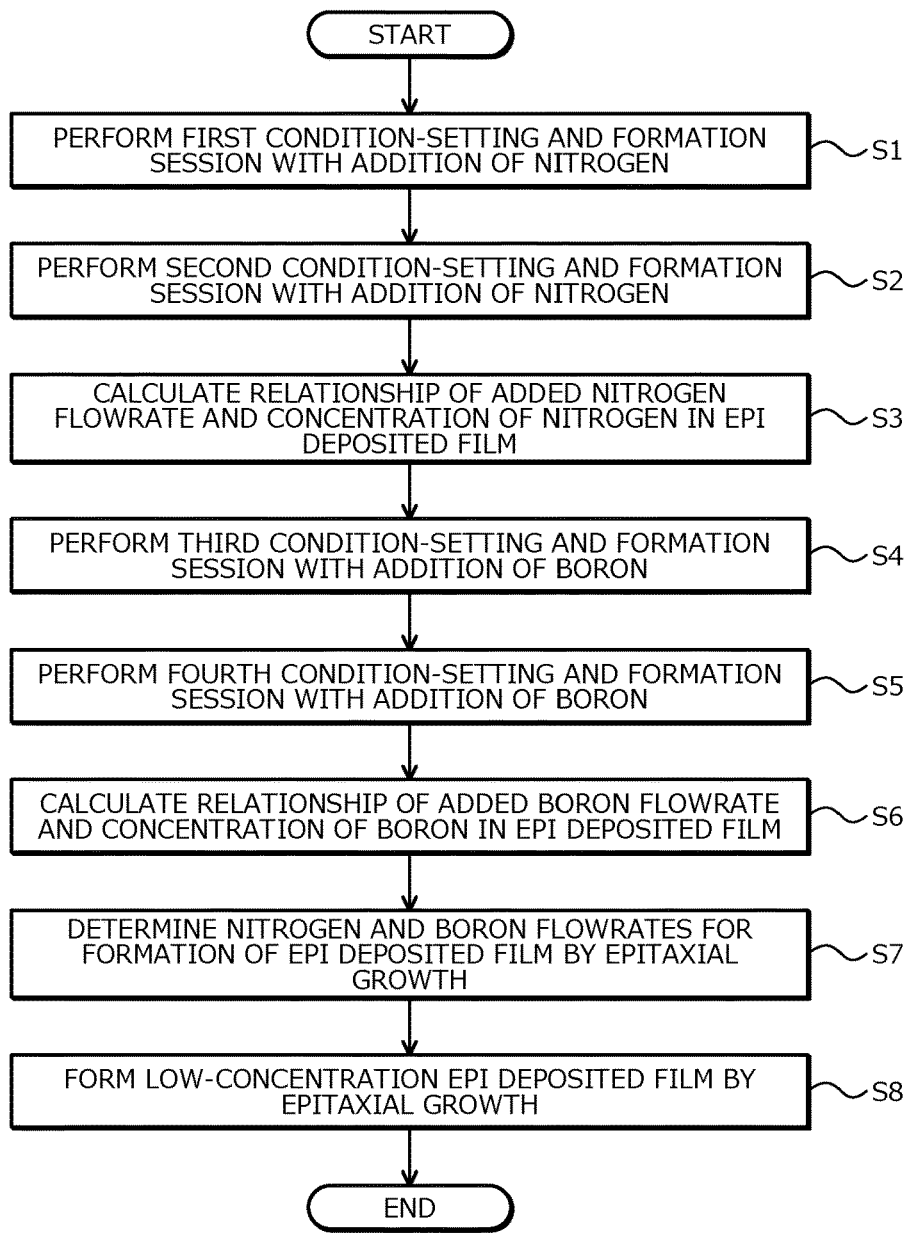
FIG. 2 is a flowchart of formation processes of the silicon carbide semiconductor substrate according to the embodiment.
Figure 3:
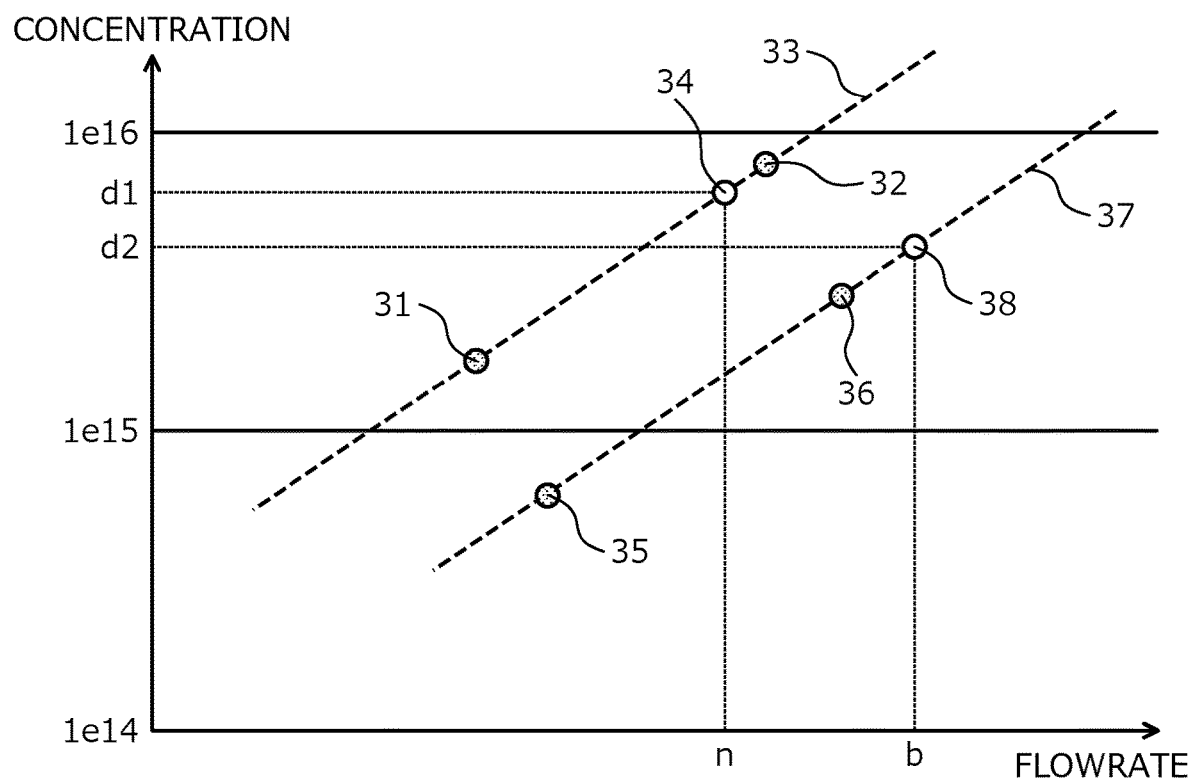
FIG. 3 is a graph indicating a relationship of impurity concentration of dopant at the time of doping and impurity concentration of an epi deposited film on the silicon carbide semiconductor substrate according to the embodiment.

Next, the method of manufacturing a silicon carbide semiconductor substrate according to the embodiment will be described. FIG. 2 is a flowchart of formation processes of the silicon carbide semiconductor substrate according to the embodiment. Further, FIG. 3 is a graph indicating the relationship of the impurity concentration of dopant at the time of doping and the impurity concentration of the epi deposited film on the silicon carbide semiconductor substrate according to the embodiment. In FIG. 3, the vertical axis indicates the concentration of nitrogen or boron in the epi deposited film formed on the silicon carbide semiconductor substrate. The concentration is indicated in units of/cm$^3$. The horizontal axis indicates flowrate of nitrogen or boron in the dopant gas. The flowrate is indicated in units of sccm or slm.

In the method of manufacturing a silicon carbide semiconductor substrate according to the embodiment, first, a first condition-setting and formation session is performed in which nitrogen is added (step S1). For example, with the temperature of a silicon carbide semiconductor substrate from 1580 to 1725 degrees C., using hydrogen (H$_2$) gas as a carrier gas, silane (SiH$_4$) gas and propane (C$_3$H$_8$) gas are concurrently supplied to the surface of the silicon carbide semiconductor substrate, and a dopant gas including nitrogen is supplied, forming an epitaxial layer. Here, concurrent supply means that the SiH$_4$ gas and the C$_3$H$_8$ gas are supplied within a few seconds of each other and not necessarily exactly at the same time. After the first condition-setting and formation session, the concentration of nitrogen in the formed epitaxial layer is measured. The nitrogen flowrate of the dopant and the concentration of nitrogen in the formed epitaxial layer in the first condition-setting and formation session are plotted at point 31 in FIG. 3.

Next, a second condition-setting and formation session is performed in which nitrogen is added (step S2). For example, with the temperature of a silicon carbide semiconductor substrate from 1580 to 1725 degrees C., using H$_2$ gas a carrier gas, SiH$_4$ gas and C$_3$H$_8$ gas are supplied concurrently to the surface of the silicon carbide semiconductor substrate, and a dopant gas including nitrogen is supplied, forming an epitaxial layer. After the second condition-setting and formation session, the concentration of nitrogen in the formed epitaxial layer is measured. The nitrogen flowrate of the dopant gas and the concentration of nitrogen in the formed epitaxial layer in the second condition-setting and formation session are plotted at point 32 in FIG. 3.

Next, a relationship of the added nitrogen flowrate and the concentration of nitrogen in the epi deposited film is calculated (step S3). For example, the result point of the first condition-setting and formation session and the result point of the second condition-setting and formation session are connected by a straight line whereby the relationship of the added nitrogen flowrate and the concentration of nitrogen in the epi deposited film is calculated. In FIG. 3, a line 33 connecting point 31 and point 32 represents the relationship of the added nitrogen flowrate and the concentration of nitrogen in the epi deposited film.

Next, a third condition-setting and formation session is performed in which boron is added (step S4). For example, with the temperature of a silicon carbide semiconductor substrate from 1580 to 1725 degrees C., using H$_2$ gas a carrier gas, SiH$_4$ gas and C$_3$H$_8$ gas are supplied concurrently to the surface of the silicon carbide semiconductor substrate, and a dopant gas including boron is supplied, forming an epitaxial layer. After the third condition-setting and formation session, the concentration of boron in the formed epitaxial layer is measured. The boron flowrate of the dopant gas and the concentration of boron in the formed epitaxial layer in the third condition-setting and formation session are plotted at point 35 in FIG. 3.

Next, a fourth condition-setting and formation session is performed in which boron is added (step S5). For example, with the temperature of a silicon carbide semiconductor substrate from 1580 to 1725 degrees C., using H$_2$ gas a carrier gas, SiH$_4$ gas and C$_3$H$_8$ gas are supplied concurrently to the surface of the silicon carbide semiconductor substrate, and a dopant gas including boron is supplied, forming an epitaxial layer. After the fourth condition-setting and formation session, the concentration of boron in the formed epitaxial layer is measured. The boron flowrate of the dopant gas and the concentration of boron in the formed epitaxial layer in the third condition-setting and formation session are plotted at point 36 in FIG. 3.

Next, a relationship of the added boron flowrate and the concentration of boron in the epi deposited film is calculated (step S6). For example, the result point of the third condition-setting and formation session and the result point of the fourth condition-setting and formation session are connected by a straight line whereby the relationship of the added boron flowrate and the concentration of boron in the epi deposited film are calculated. In FIG. 3, a line 37 connecting point 35 and point 36 represents the relationship of the added boron flowrate and the concentration of boron in the epi deposited film.

Here, the sequence of steps S1 to S3 and steps S4 to S6 may be reversed. In other words, after steps S4 to S6 are executed, steps S1 to S3 may be executed.

Next, the nitrogen and boron flowrates for forming the epi deposited film by epitaxial growth are determined (step S7). For example, point 34 on the line 33 and a point 38 on the line 37 satisfying condition 1 and condition 2 below are set.

Condition 1: A nitrogen concentration d1 of the epi deposited film at point 34 and a boron concentration d2 of the epi deposited film at point 38 are equal to or higher than an impurity concentration not affected by impurities inside the epitaxial growth equipment. In particular, the nitrogen concentration d1 of the epi deposited film at point 34 and the boron concentration d2 of the epi deposited film at point 38 are $1\times10^{15}/cm^3$ or higher.

Condition 2: The difference (d1−d2) of the nitrogen concentration d1 of the epi deposited film at point 34 and the boron concentration d2 of the epi deposited film at point 38 is within a range from $1\times10^{14}/cm^3$ to $1\times10^{15}/cm^3$. A flowrate n of nitrogen at the time of epitaxial growth is determined by the determined point 34 and a flowrate b of boron at the time of epitaxial growth is determined by the determined point 38.

Next, a low-concentration epi deposited film is formed by epitaxial growth (step S8). For example, with the temperature of a silicon carbide semiconductor substrate from 1580 to 1725 degrees C., using $H_2$ gas a carrier gas, $SiH_4$ gas and $C_3H_8$ gas are supplied concurrently to the surface of the silicon carbide semiconductor substrate, and a dopant gas including nitrogen and boron is supplied, forming an epitaxial layer. The nitrogen flowrate in the dopant gas is set as the flowrate n determined at step S7 and the boron flowrate in the dopant gas is set as the flowrate b determined at step S7.

Thus, a series of operations according to the flowchart ends. By implementing the present flowchart, the n⁻-type epitaxial layer 2 having an impurity concentration from $1\times10^{14}/cm^3$ to $1\times10^{15}/cm^3$ is formed by epitaxial growth on the n-type silicon carbide substrate 1.

In the embodiment, although a condition-setting and formation session is performed with respect to nitrogen and boron two times each, the condition-setting and formation session may be performed three times or more. In this case, the relationship of the added nitrogen flowrate and the concentration of nitrogen in the epi deposited film, and the relationship of the added boron flowrate and the concentration of boron in the epi deposited film may be obtained by calculating a straight line nearest plotted measurement points.

In an EXAMPLE, on an Si face of an n-type single crystal 4H—SiC (4-layer periodic hexagonal silicon carbide) substrate having a thickness of 365 μm and a diameter of 100 mm, an n⁻-type epitaxial layer having a set concentration of $4\times10^{14}/cm^3$ and a set thickness of 100 μm was formed by epitaxial growth.

The epitaxial growth of the n⁻-type epitaxial layer on the n-type single crystal 4H—SiC substrate was performed in a quartz reaction tube having installed therein, a SiC susceptor covered by an insulating material. Here, first-half grinding, first-half polishing, and chemical mechanical polishing (CMP) processes were performed for the Si face that is an epi growth surface, pure water ultrasonic cleaning/organic solvent ultrasonic cleaning/Sulfuric Acid Peroxide Mixture (SPM) cleaning/RCA (wet cleaning using strong acid and high basic solution) cleaning were performed, and the n-type single crystal 4H—SiC substrate in a sufficiently clean state was set on a susceptor in a chamber of epitaxial growth equipment. Next, after the inside of the epitaxial growth equipment was high-vacuum exhausted, $H_2$ gas was introduced into the epitaxial growth equipment, and the single crystal 4H—SiC substrate was heated by high-frequency induction heating.

The $H_2$ gas, which is a carrier gas, was flowed at 150 slm for 18 minutes at 1605 degrees C. and the n-type single crystal 4H—SiC substrate was etched.

The temperature was increased to an epi growth temperature of 1630 degrees C. At 1660 degrees C., the first condition-setting and formation session was performed flowing $H_2$ gas at 100 slm, flowing $SiH_4$ (monosilane) gas at 185 sccm, flowing $C_3H_8$ gas at 74 sccm, flowing a gas having a nitrogen concentration of 10% diluted by hydrogen at 30 sccm, and setting a pressure of 10300 Pa, and a single crystal 4H—SiC epi deposited film was formed by epi growth. In the single crystal 4H—SiC epi deposited film, the concentration of nitrogen, which was the dopant, was $3.4\times10^{15}/cm^3$.

By a same technique, a gas having a nitrogen concentration of 10% diluted by hydrogen was flowed at 60 sccm and the second condition-setting and formation session was performed, forming a single crystal 4H—SiC epi deposited film by epi growth. In the single crystal 4H—SiC epi deposited film, the concentration of nitrogen, which was the dopant, was $7.5\times10^{15}/cm^3$.

By a same technique, a gas having a boron concentration of 10% diluted by hydrogen was flowed at 50 sccm and the third condition-setting and formation session was performed, forming a single crystal 4H—SiC epi deposited film. In the single crystal 4H—SiC epi deposited film, the concentration of boron, which was the dopant, was $3.8\times10^{15}/cm^3$. By a similar technique, a gas having a boron concentration of 10% diluted by hydrogen was flowed at 90 sccm and the fourth condition-setting and formation session was performed, forming a single crystal 4H—SiC epi deposited film. In the single crystal 4H—SiC epi deposited film, the concentration of boron, which was the dopant, was $7.3\times10^{15}/cm^3$.

From the results of the first condition-setting and formation session to the fourth condition-setting and formation session, as a condition for forming a low-concentration epi deposited film by epitaxial growth, a gas having a nitrogen concentration of 10% diluted by hydrogen is to be flowed at 53 sccm, and a gas that has a boron concentration of 10% diluted by hydrogen is to be flowed at 77 sccm were determined.

From the first condition-setting and formation session to the fourth condition-setting and formation session, similarly, the n-type single crystal 4H—SiC substrate was etched and thereafter, at 1660 degrees C., $H_2$ gas was flowed at 100 slm, $SiH_4$ gas was flowed at 185 sccm, $C_3H_8$ gas was flowed at 74 sccm, a gas having a nitrogen concentration of 10% diluted by hydrogen was flowed at 53 sccm, and a gas having a boron concentration of 10% diluted by hydrogen was flowed at 77 sccm and with a pressure of 10300 Pa, a single crystal 4H—SiC epi deposited film of 100 μm was formed by epitaxial growth. The impurity concentration of the single crystal 4H—SiC epi deposited film formed by epitaxial growth was $4\times10^{14}/cm^3$. Values in the EXAMPLE are one example and various modifications are possible.

As described, according to the silicon carbide semiconductor substrate of the embodiment, by making the concentration of nitrogen in the epi deposited film $1\times10^{14}/cm^3$ to $1\times10^{15}/cm^3$ higher than the concentration of boron in the epi deposited film, a low-impurity-concentration epi deposited film having an impurity concentration from $1\times10^{14}/cm^3$ to $1\times10^{15}/cm^3$ may be formed. Further, by making the concentration of nitrogen in the n⁻-type epitaxial layer and the concentration of boron in the n⁻-type epitaxial layer equal to or higher than a concentration that is not affected by impurities inside the epitaxial growth equipment, the effects of the impurities inside the epitaxial growth equipment may be reduced.

Further, impurities inside the epitaxial growth equipment are nitrogen and boron and therefore, nitrogen and boron are respectively set as a donor and acceptor whereby effects of impurities inside the epitaxial growth equipment may be reduced. Further, since the difference of the concentration of nitrogen in the epi deposited film and the concentration of boron in the epi deposited film suffices to be from $1 \times 10^{14}/cm^3$ to $1 \times 10^{15}/cm^3$, the concentration of nitrogen in the epi deposited film and the concentration of boron in the epi deposited film may be adjusted thereby enabling carrier lifetime to be controlled.

Even when C/Si increases and the atmosphere in the furnace varies, both nitrogen and boron are atoms entering the carbon side. As a result, even when C/Si increases, the relationship of the concentration of nitrogen in the dopant gas and the concentration of nitrogen in the epi deposited film, and the relationship of the concentration of boron in the dopant gas and the concentration of boron in the epi deposited film vary similarly. Therefore, taking the difference becomes the same and a C/Si increase does not affect the nitrogen concentration of the epi deposited film or the boron concentration of the epi deposited film.

Further, in the present invention, on a silicon carbide semiconductor substrate, before a low impurity concentration epi deposited film is formed, a condition-setting and formation session is performed four times. Although it takes time to perform the four condition-setting and formation sessions, without the four condition-setting and formation sessions, formation of a low impurity concentration epi deposited film fails and compared to repeating formation processes, less time is consumed.

However, with the conventional techniques, concentration control with respect to depth in the epi deposited film is difficult and at shallow areas, the impurity concentration increases to $1 \times 10^{15}/cm^3$ or higher, making formation of a low-concentration epi deposited film of less than $1 \times 10^{15}/cm^3$ impossible.

This results because the impurity concentration of the epi deposited film is low and consequently, the effects of impurities inside the epitaxial growth equipment for forming the single crystal SiC entering the epi deposited film cannot be ignored and an epi deposited film having an impurity concentration higher than a target impurity concentration is formed.

Figure 4:
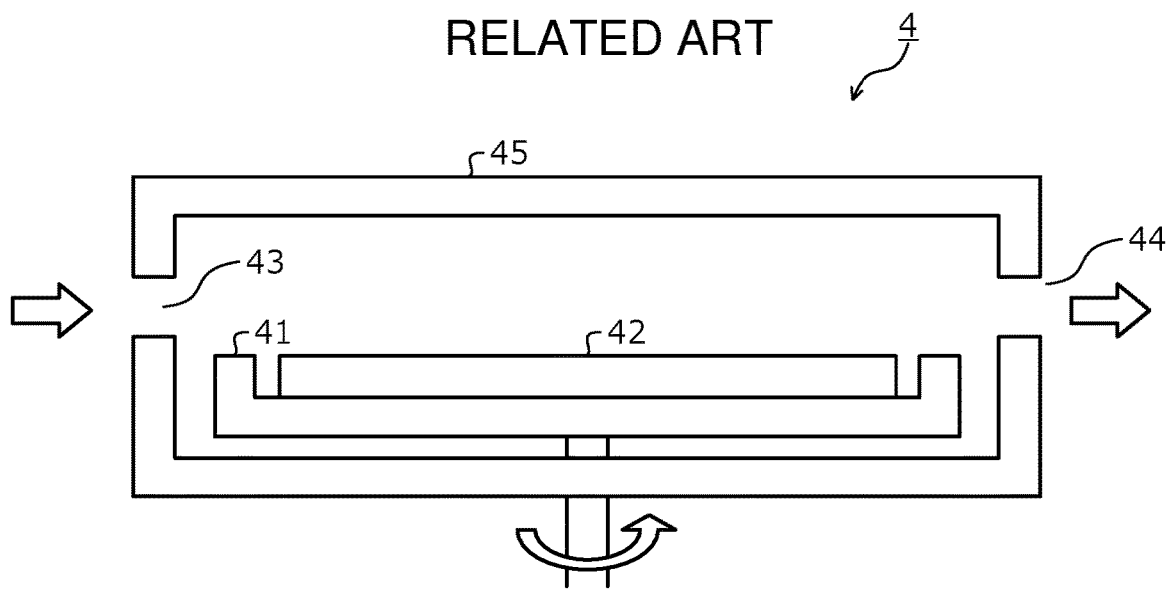
FIG. 4 is a cross-sectional view of a structure of epitaxial growth equipment.

An epi deposited film having an impurity concentration higher than a target impurity concentration is formed as described in more detail herein. FIG. 4 is a cross-sectional view of a structure of epitaxial growth equipment 4. In the epitaxial growth equipment 4, in a direction indicated by an arrow, carrier gas and dopant gas are introduced and move from a gas inlet 43 to a gas outlet 44 in a horizontal direction. The dopant gas is mainly supplied to a surface side of a semiconductor substrate 42, a susceptor 41 is heated by non-depicted heating equipment such as an induction heating (IH) coil, and an epi deposited film is formed on the semiconductor substrate 42. The epitaxial growth equipment 4 in FIG. 4 is an example of a horizontal hot wall design and although the susceptor 41 rotates, the semiconductor substrate 42 does not and the epi deposited film is formed without the semiconductor substrate 42 rotating. Further, the epitaxial growth equipment 4 is surrounded by an insulating material 45 that includes a graphite member.

With atmospheric exposure during maintenance, nitrogen is taken in by the graphite member of the epitaxial growth equipment 4. Therefore, before formation of the epi deposited film is performed, to determine concentration dependency with respect to nitrogen, conditions are set and formation is performed. Based on these results, actual formation of the epi deposited film is performed.

FIG. 5 is graph of results obtained when conditions were set and formation was performed to determine concentration dependency in a conventional silicon carbide semiconductor substrate. In FIG. 5, the vertical axis indicates nitrogen concentration of an epi deposited film formed on a silicon carbide semiconductor substrate. The nitrogen concentration is indicated in units of/$cm^3$. The horizontal axis indicates a flowrate of nitrogen in the dopant gas. The flowrate is indicated in units of standard cubic centimeters per minute (sccm) or standard liters per minute (slm).

First, as first session of condition-setting and formation session, a dopant gas including a predetermined concentration of nitrogen is supplied and on a silicon carbide semiconductor substrate, for example, an epi deposited film of 10 μm is formed and the concentration of nitrogen in the formed epi deposited film is measured. This result is represented by point 51. Next, as a second session of condition-setting and formation session, the dopant gas including nitrogen at a flowrate different from that in the first session of condition-setting and formation session is supplied and on a silicon carbide semiconductor substrate, for example, an epi deposited film of 6 μm is formed and the concentration of nitrogen in the formed epi deposited film is measured. This result is represented by point 52.

Next, a line 53 connecting point 51 and point 52 is calculated. The line 53 represents the relationship of the nitrogen flowrate in the dopant gas and the concentration of nitrogen in the epi deposited film. From this line, it is found that when an epi deposited film having a concentration dt of point 54 is formed, the nitrogen flowrate in the dopant gas is to be set to be n2.

However, when an epi deposited film of, for example, 30 μm is actually formed on a silicon carbide semiconductor substrate, the nitrogen concentration of the formed epi deposited film is a position of point 55, an epi deposited film having an impurity concentration higher than the target impurity concentration is formed, not a low-concentration epi deposited film.

This results because the graphite member of the epitaxial growth equipment includes boron (B). Therefore, in the condition-setting and formation session, boron is taken into the epi film whereby the concentration control is underestimated. Furthermore, in the actual epi deposited film, consequent to exhaustion of boron from the graphite member, exhaustion of nitrogen from the graphite member, and attachment of SiC products on furnace walls of the epitaxial growth equipment, a rate of (C/Si) carbon to silicon increases and the atmosphere inside the furnace varies. Therefore, concentration control is underestimated. For these reasons, the epi deposited film is formed having an impurity concentration that is higher than the target impurity concentration and no low-concentration epi deposited film is formed.

Thus, when the impurity concentration of the epi deposited film is low, the effects of nitrogen or boron inside the epitaxial growth equipment entering the epi deposited film cannot be ignored and an epi deposited film having an impurity concentration higher than the target impurity concentration is formed. Therefore, formation of an epi deposited film having an impurity concentration of $1 \times 10^{14}/cm^3$ to $1 \times 10^{15}/cm^3$ is difficult.

As described, according to the silicon carbide semiconductor substrate of the present invention, by making the donor concentration of the epitaxial layer $1 \times 10^{14}/cm^3$ to $1 \times 10^{15}/cm^3$ higher than the acceptor concentration of the epitaxial layer, a low-impurity-concentration epi deposited film having an impurity concentration from $1\times10^{14}/cm^3$ to $1\times10^{15}/cm^3$ may be formed. Further, by making the donor concentration of the epitaxial layer and the acceptor concentration of the epitaxial layer equal to or higher than a concentration that is not affected by impurities inside the epitaxial growth equipment, the effects of the impurities inside the epitaxial growth equipment may be reduced.

The silicon carbide semiconductor substrate and the method of manufacturing a silicon carbide semiconductor substrate according to the present invention achieve an effect in that a silicon carbide semiconductor substrate having a low-concentration epi deposited film of an impurity concentration of $1\times10^{14}/cm^3$ to $1\times10^{15}/cm^3$ may be provided.

As described, the silicon carbide semiconductor substrate and the method of manufacturing a silicon carbide semiconductor substrate according to the present invention are useful for semiconductor substrates of high-voltage semiconductor devices used in power converting equipment and power supply devices such as in industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor substrate, the method comprising
    supplying a dopant gas including a donor and an acceptor, to form a film of an n-type single crystal silicon carbide on a single crystal silicon carbide substrate by epitaxial growth, wherein
    each of a flowrate of the donor and a flowrate of the acceptor in the dopant gas is equal to or higher than a flowrate by which a donor concentration of the film and an acceptor concentration of the film are a concentration unaffected by an impurity inside epitaxial growth equipment, and
    the flowrate of the donor and the flowrate of the acceptor in the dopant gas is set to obtain a difference in a range of $1\times10^{14}/cm^3$ to $1\times10^{15}/cm^3$ by subtracting the acceptor concentration of the film from the donor concentration of the film.

2. A method of manufacturing a silicon carbide semiconductor substrate, the method comprising:
    supplying a donor dopant gas including the donor, forming a first relationship film of a single crystal silicon carbide on a single crystal silicon carbide substrate by epitaxial growth, and obtaining a first relationship of a flowrate of the donor in the donor dopant gas and a donor concentration of the first relationship film;
    supplying an acceptor dopant gas including the acceptor, forming a second relationship film of a single crystal silicon carbide on a single crystal silicon carbide substrate by epitaxial growth, and obtaining a second relationship of a flowrate of the acceptor in the acceptor dopant gas and an acceptor concentration of the second relationship film;
    determining the flowrate of the donor and the flowrate of the acceptor in the dopant gas including the donor and the acceptor based on the first relationship and the second relationship;
    supplying a dopant gas including a donor and an acceptor, and forming a film of a single crystal silicon carbide on a single crystal silicon carbide substrate by epitaxial growth, wherein
    each of a flowrate of the donor and a flowrate of the acceptor in the dopant gas is equal to or higher than a flowrate so that a donor concentration of the film and an acceptor concentration of the film are unaffected by an impurity inside epitaxial growth equipment, and
    the flowrate of the donor and the flowrate of the acceptor in the dopant gas is set to obtain a difference of the donor concentration of the film and the acceptor concentration of the film in a range of $1\times10^{14}/cm^3$ to $1\times10^{15}/cm^3$.

3. The method according to claim 1, wherein the donor is nitrogen and the acceptor is boron.

4. The method according to claim 1, wherein a sum of the donor concentration and the acceptor concentration unaffected by the impurity is $1\times10^{15}/cm^3$ or higher.

5. The method according to claim 1, wherein supplying a dopant gas including a donor and an acceptor includes introducing a source gas for the single crystal silicon carbide into a chamber together with the dopant gas, thereby to start an epitaxial growth process for forming the film of a single crystal silicon carbide.

6. The method according to claim 2, wherein the donor is nitrogen and the acceptor is boron.

7. The method according to claim 2, wherein a sum of the donor concentration and the acceptor concentration unaffected by the impurity is $1\times10^{15}/cm^3$ or higher.

* * * * *